(12) United States Patent
Lee et al.

(10) Patent No.: US 6,285,866 B1
(45) Date of Patent: Sep. 4, 2001

(54) SINGLE-CHIP RADIO STRUCTURE WITH PIEZOELECTRIC CRYSTAL DEVICE INTEGRATED ON MONOLITHIC INTEGRATED CIRCUIT AND METHOD OF FABRICATING THE SAME

(75) Inventors: Kwyro Lee, Taejon; Yun Seong Eo, Seoul; Seokbong Hyun, Taejon-si, all of (KR)

(73) Assignee: Korea Advanced Institute of Science & Technology, Taejon-si (KR)

( * ) Notice: Subject to any disclaimer, the term of this patent is extended or adjusted under 35 U.S.C. 154(b) by 0 days.

(21) Appl. No.: 09/336,297

(22) Filed: Jun. 21, 1999

(30) Foreign Application Priority Data

Oct. 30, 1998 (KR) .................................................. 98-46333

(51) Int. Cl.[7] ...................................................... H04B 1/26
(52) U.S. Cl. ........................... 455/318; 455/333; 29/25.35
(58) Field of Search .................................... 455/318, 334, 455/316, 321, 323, 333; 29/25.35, 216, 427

(56) References Cited

U.S. PATENT DOCUMENTS

| | | | |
|---|---|---|---|
| 3,886,504 | * 5/1975 | Hartmann et al. | 333/72 |
| 5,020,147 | * 5/1991 | Okanobu | 455/302 |
| 5,265,267 | 11/1993 | Martin et al. | 455/326 |
| 5,918,168 | * 6/1999 | Abe et al. | 455/315 |

* cited by examiner

Primary Examiner—Edward F. Urban
(74) Attorney, Agent, or Firm—Bachman & LaPointe, P.C.

(57) ABSTRACT

A single-chip radio structure with a piezoelectric crystal device integrated on a monolithic integrated circuit and a method of fabricating the same. A thin or thick piezoelectric crystal wafer is bonded on a silicon substrate and adjusted in thickness by mechanical grinding and polishing processes. Then, a surface acoustic wave resonator and other passive devices such as a filter, inductor, etc. are formed on the piezoelectric crystal wafer by a standard lithography process. Therefore, a high-precision oscillator and various passive devices can be included in a monolithic integrated circuit to implement a single-chip radio structure. This single-chip radio structure has the effect of reducing the volume and weight of the entire receiver while maintaining excellent performances provided by passive devices on a crystal substrate, such as frequency stability, frequency linearity and low power consumption, etc., as they are.

1 Claim, 5 Drawing Sheets

Prior Art

Prior Art

SINGLE-CHIP RADIO STRUCTURE WITH PIEZOELECTRIC CRYSTAL DEVICE INTEGRATED ON MONOLITHIC INTEGRATED CIRCUIT AND METHOD OF FABRICATING THE SAME

BACKGROUND OF THE INVENTION

1. Field of the Invention

The present invention relates in general to a single chip with a piezoelectric crystal device integrated on a monolithic integrated circuit, and more particularly to a single-chip radio structure with a piezoelectric crystal device such as a surface acoustic wave resonator, precise reference frequency generator and other passive devices integrated on a monolithic integrated circuit and a method of fabricating the same, in which a silicon substrate, a thick or thin piezoelectric crystal on silicon (TPCS) and a metal layer are provided to implement a single-chip transmission/reception system for a portable terminal.

2. Description of the Prior Art

In portable communication systems which have recently been studied, there has been of more importance a technique for fabricating devices which are low in power consumption, small in size and low in cost under the condition that they satisfy all specifications on reception sensitivity, channel selection, etc. Due to the recent trend where devices become smaller in size through developments in microelectronic fabrication technology, the above aims have been accomplished to a certain degree with respect to intergrated circuits composed of a number of transistors. However, passive devices such as a crystal resonator, filter, inductor, etc. are discrete components which are still large in volume. As a result, such devices are the main obstacles in the miniaturation of a transceiver.

Generally, a clock generator or a reference frequency generator for communication equipment comprises a hybrid circuit consisting of a crystal resonator, oscillator and control circuit, which may be constructed in any one of various manners such as Colpitts, Hartley and Clapp. A typical Colpitts-type oscillator is shown in FIG. 1, herein.

In a conventional oscillator shown in FIG. 1, a crystal resonator X10 is operated based on a characteristic of a quartz crystal which is very stable in mechanical resonance frequency. The quartz crystal is of a thin membrane shape and the resonance frequency thereof is proportional to inverse of the thickness thereof. Noticeably, because a resonance frequency of 100 MHZ corresponds to a very thin thickness of about several tens $\mu$m, it is impossible to obtain the higher resonance frequency.

The low resonance frequency of the crystal may be made higher by using a frequency multiplier composed of an inductor L19, resistor R20 and capacitor C21 in FIG. 1 or a so-called phase locked loop (PLL). Alternatively, a surface acoustic wave resonator shown in FIG. 2 may be replaced for the conventional crystal to raise a basic mode resonance frequency. However, such devices are conventionally used as external devices because they are difficult to be implemented on silicon integrated circuits. In particular, the surface acoustic wave resonator is difficult to be integrated. Many studies have been made since the 1970's of using, for a UHF-band reference signal generator, a surface acoustic wave resonator which is capable of obtaining a high frequency and has an advantage of ease in mass production, instead of conventional means based on a high-frequency resonance mode of a crystal and a frequency multiplier (see: Acoustic Surface Wave Resonator Devices, U.S. Pat. No. 3,886,504, May 20, 1974).

FIGS. 2 and 3 show a conventional 2-terminal surface acoustic wave resonator. This surface acoustic wave resonator is to use a phenomenon where a resonance occurs as an elastic wave or acoustic wave is produced on a piezoelectric substrate 51 and then blocked by acoustic wave reflectors 56 and 57. In this resonator, the basic principle of the resonace and equivalent circuit model are the same as those of a conventional quartz crystal resonator.

But, the surface acoustic wave resonator utilizes a surface acoustic wave component which mechanically resonates along the surface of a crystal on which various electrodes 52–57 are laid, whereas the conventional crystal resonator utilizes a resonance mode of a bulk acoustic wave which mechanically resonates in the direction of a thickness of a thin crystal.

In the 2-terminal surface acoustic wave resonator shown in FIGS. 2 and 3, when a variation of a voltage signal across lead wires 62 and 64 in FIG. 2 is applied to transducer electrodes 52 and 54 formed on the surface of a crystal, a fine mechanical displacement is formed on and propagated along the crystal surface due to properties of a piezoelectric material to produce a surface acoustic wave. The produced surface acoustic wave is detected by a transducer composed of electrodes 53 and 55, which transduces the mechanical resonance into an electrical signal in the reverse procedure of the generation of surface waves.

In such a surface acoustic wave device, a bulk acoustic wave component may be generated, reflect from the bottom of the crystal bordered on a metal plate 60 and return to the transducer electrodes 53 and 55 formed on the surface of the crystal. This bulk acoustic wave component becomes a factor of deteriorating characteristics of the device. In order to suppress such an effect of the bulk acoustic wave component on the characteristics of the device, an acoustic absorption material such as epoxy may be applied on the bottom of the crystal to absorb a part of the wave component arriving at the bottom and irregularly reflect the remainder.

A resonance frequency of the surface acoustic wave resonator is determined depending on a distance or pitch between two electrodes just adjacent respectively to the reflectors 56 and 57, twice which is a wavelength of a resonance mode.

Accordingly, the maximum possible resonance frequency of the surface acoustic wave resonator is determined according to a line width in a semiconductor manufacturing process. Typically, a lithography process with a resolution of up to 1 $\mu$m is used to obtain a basic mode resonance frequency higher than 1 GHz.

Noticeably, the above-mentioned surface acoustic wave resonator or conventional crystal resonator is provided with one type of substrate 51 composed of only a piezoelectric crystal. For this reason, a hybrid circuit must be provided on a printed circuit board (PCB) to connect the surface acoustic wave resonator to other integrated circuits formed on silicon or GaAs substrates. In this case, signals must be passed through a bonding wire 61 and lead wires 62, 63, 64 and 65 for connection with the chip circuits, resulting in increases in occupied area and PCB manufacturing cost as compared with a single-chip integrated circuit structure.

As a result, studies have recently been made of integrating surface acoustic wave devices with silicon or gallium-arsenide circuits on a single chip. Such studies may generally be classified into a method of forming a surface acoustic wave device by depositing a piezoelectric material such as ZnO or AlN on a silicon substrate (see: ZnO Films on {110}-Cut <100>-Propagating GaAs Substrates for Surface Acoustic Wave Device Applications, IEEE Trans. Ultrason. Ferroelec. Freq. Cont., vol. 42. pp. 351–361, 1995) and a method of providing a surface acoustic wave device in an integrated circuit by bonding a thick crystal or $LiNbO_3$ crystal on silicon (see: Integrated Circuit including a Surface Acoustic Wave Transformer and a Balanced Mixer, U.S. Pat. No. 5,265,267, 1993).

However, in the deposition method, a frequency stability of the deposited ZnO or AlN with respect to variations in temperature and time is inferior to that of a piezoelectric single crystal. For this reason, the deposition method is not suitable for a reference frequency generator of a communication system with a strict standard.

Generally, in a piezoelectric crystal, the speed of a surface acoustic wave varies on the order of 20 to 30 ppm with respect to a temperature variation of 0° to 50°. Further, the piezoelectric crystal has a long-term stability wherein a resonance frequency varies on the order of 1 ppm for one year, which is on an improved trend. In this connection, in the case where the piezoelectric crystal is used as a substrate of a surface acoustic wave resonator, it will offer sufficient frequency stability and precision, as is well known in the art.

Hence, in order to maintain a frequency stability at a degree satisfying the communication system standard and increase an integration level of a transceiver circuit without depending on a frequency multiplier generating undesirable higher harmonics, there is required a method of bonding a piezoelectric crystal on silicon to make a piezoelectric crystal/silicon structure and forming a surface acoustic wave device and other passive devices on the piezoelectric crystal/silicon structure.

On the other hand, in the second method of bonding a thick crystal or $LiNbO_3$ crystal on silicon, the associated fabrication method is not specified and the entire device is large in thickness because the piezoelectric crystal is not adjusted in thickness. Further, in the case where a surface acoustic wave device is formed on the piezoelectric crystal, it is difficult to be connected to an integrated circuit. Moreover, it is hard to provide a single-chip transmitter/receiver or radio structure with even passive devices such as an inductor, transmission line, etc., integrated therein.

SUMMARY OF THE INVENTION

Therefore, the present invention has been made in view of the above problems, and it is an object of the present invention to provide a single-chip radio structure with a piezoelectric crystal device for precise frequency control, such as a surface acoustic wave resonator, and other passive devices integrated on a monolithic integrated circuit and a method of fabricating the same, in which a piezoelectric crystal wafer with a thickness adjusted by mechanical grinding and polishing processes is bonded on a silicon substrate to implement a single-chip transmission/reception system.

In accordance with the present invention, the above and other objects can be accomplished by a provision of a single-chip transmitter/receiver structure with a piezoelectric crystal device for the generation of a stable reference frequency, such as a surface acoustic wave resonator, and other passive devices integrated on a silicon integrated circuit. Piezoelectric crystal wafer bonded on a finished silicon wafer and the surface of piezoelectric wafer is subjected to mechanical grinding and polishing processes to adjust a thickness of the crystal wafer. Formed on the surface of the resultant piezoelectric crystal wafer is a metal layer for forming transducer electrodes and acoustic wave reflectors and passive devices such as an inductor. An existing semiconductor manufacturing process is directly utilized to provide a device using piezoelectric material such as quartz crystal and other passive devices, such as an inductor, in an integrated circuit while satisfying specifications on a frequency stability required by communication equipment. Preferably, the piezoelectric crystal device may be a surface acoustic wave resonator.

In a feature of the present invention, there is provided a single-chip radio structure with a piezoelectric crystal device integrated on a monolithic integrated circuit, comprising a silicon substrate; a piezoelectric crystal wafer bonded on the silicon substrate, the piezoelectric crystal wafer being adjusted in thickness by mechanical grinding and polishing processes; the piezoelectric crystal device formed on the piezoelectric crystal wafer, the piezoelectric crystal device including at least one surface acoustic wave resonator for selecting a specific frequency; a plurality of passive circuit devices selectively formed on the piezoelectric crystal wafer; the monolithic integrated circuit formed on the silicon substrate, the monolithic integrated circuit including partial or all components of a radio transceiver; and a metal wire for connecting the piezoelectric crystal device and passive circuit devices formed on the piezoelectric crystal wafer directly to the monolithic integrated circuit formed on the silicon substrate.

In another feature of the present invention, there is provided a method of fabricating a single-chip radio structure with a piezoelectric crystal device integrated on a monolithic integrated circuit, comprising the first step of bonding a piezoelectric crystal wafer on a silicon substrate; the second step of adjusting a thickness of the piezoelectric crystal wafer by using mechanical grinding and polishing processes; and the third step of forming the piezoelectric crystal device and other passive devices on the piezoelectric crystal wafer, the piezoelectric crystal device including at least one surface acoustic wave resonator for selecting a specific frequency.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 4:
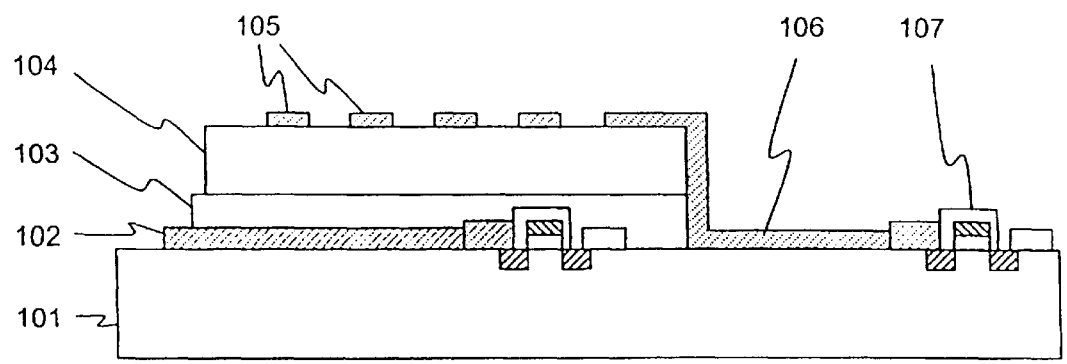
FIG. 4 is cross-sectional view of a surface acoustic wave resonator formed on a silicon substrate in accordance with the present invention.

FIG. 4 is a sectional view of a surface acoustic wave resonator with a thin or thick crystal/silicon structure in accordance with the present invention. As shown in this drawing, the crystal/silicon structure comprises a silicon substrate 101, a thin piezoelectric crystal wafer 104 and an epoxy bonding layer 103.

The piezoelectric crystal wafer 104 is subjected to mechanical grinding and polishing processes in such a manner that it can have a thickness smaller than 50 μm. The epoxy bonding layer 103 has a thickness smaller than 3 μm. As a result, a thickness from the surface of the silicon substrate 101 to the surface of the piezoelectric crystal wafer 104 is about 55 μm at the maximum, so that a surface acoustic wave device formed on the piezoelectric crystal wafer 104 can be connected with a circuitry 107 on the silicon substrate 101 through a metal inter connection layer 106, or wire-bonding.

Figure 6:
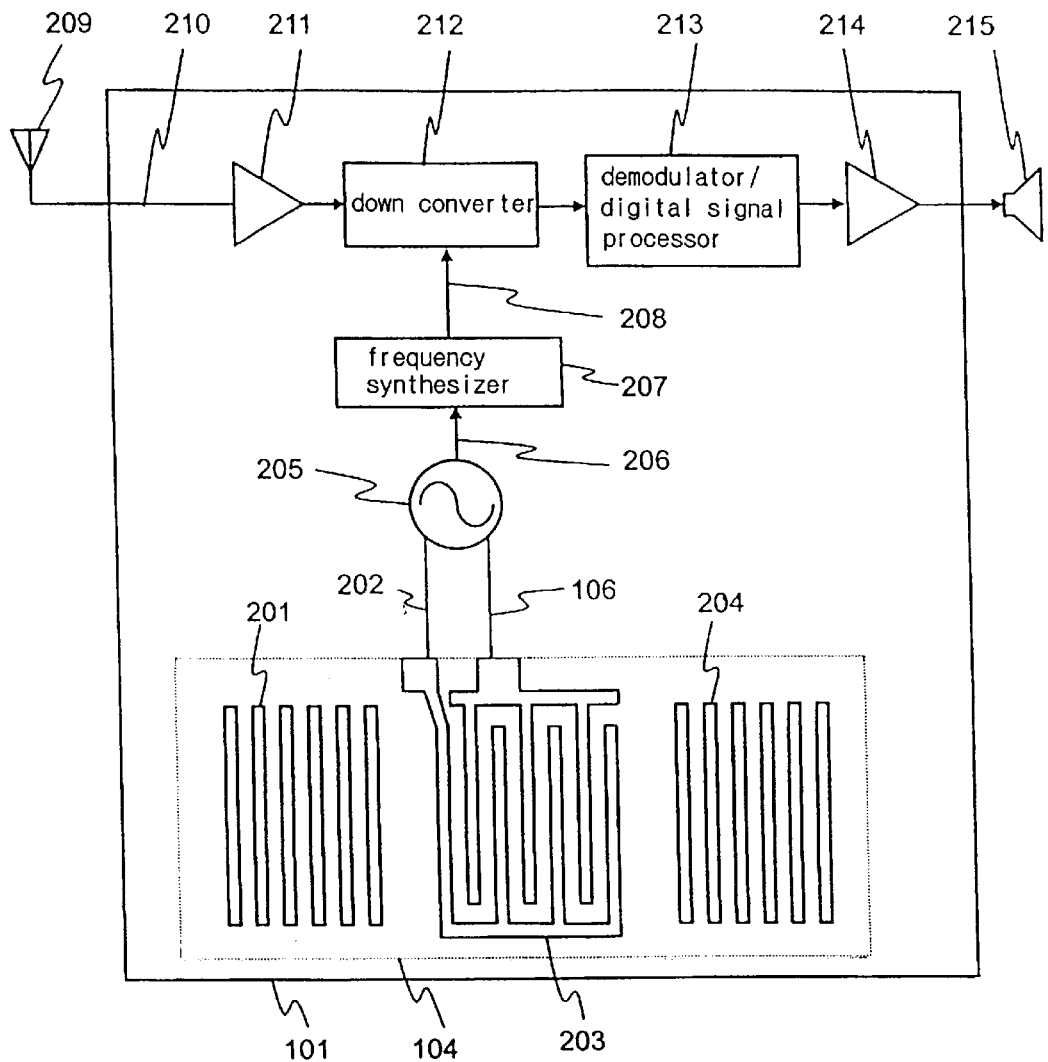
FIG. 6 is a block diagram of a radio frequency receiver connected to the surface acoustic wave resonator in FIG. 4.

The surface acoustic wave resonator comprises a metal pattern 105 including a transducer electrode 203 and reflection gratings 201 and 204 disposed as shown in FIG. 6.

Figure 3:
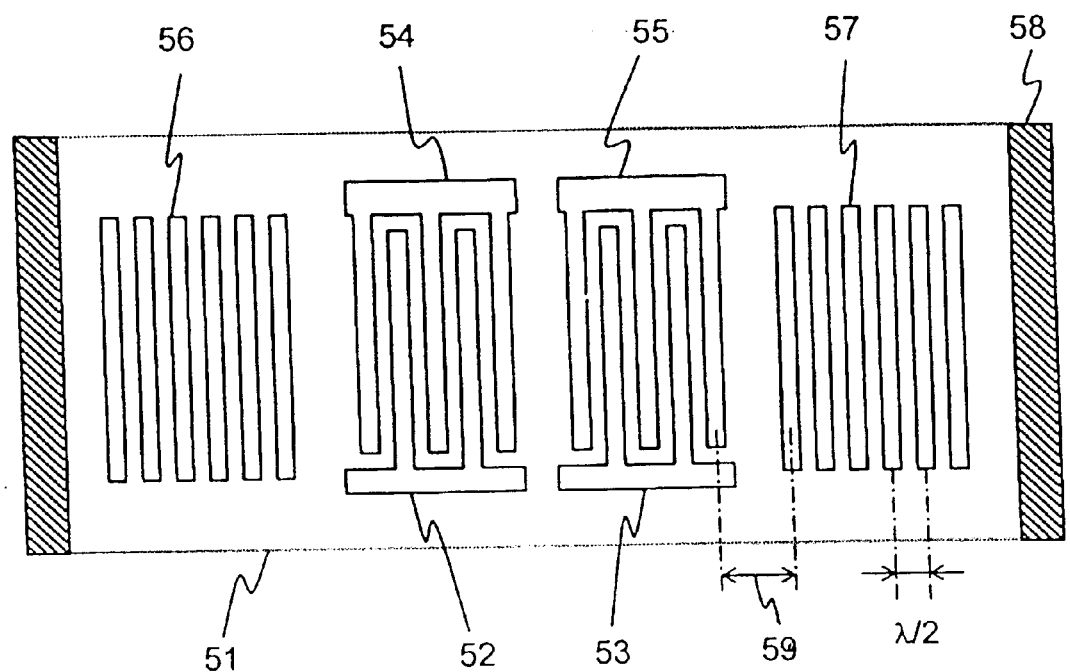
FIG. 3 is a plan view of the conventional 2-terminal surface acoustic wave resonator in FIG. 2.

In each of the reflection gratings 201 and 204 and interdigital transducer electrode 203, two adjacent metal lines must have a distance therebetween which is equal to half a wavelength of a surface acoustic wave causing a resonance, as indicated in the reflection grating 57 of FIG. 3. Each of the electrodes must have a sufficient width to prevent a characteristic degradation resulting from a diffraction of the acoustic wave.

In designing the metal electrodes 201, 203 and 204 of the surface acoustic wave resonator, an input impedance at input terminals 106 and 202 with respect to the resonator, a resonance frequency and a resonance Q value must be mainly considered. Further, determination has to be made about whether the resonator will be constructed in a 1-terminal type as shown in FIG. 6 or a 2-terminal type as shown in FIG. 3. Moreover, it must be determined whether an impedance matching circuit will be used for the resonator.

Formed on the piezoelectric crystal wafer 104 of FIGS. 4 and 6 may be other well-known passive circuit elements such as a high-Q inductor, electromagnetic delay line, filter, etc., as well as the surface acoustic wave resonator. The epoxy bonding layer 103 and metal layer 102 are applied between the silicon substrate 101 and the piezoelectric crystal wafer 104 to bond them to each other. The epoxy bonding layer 103 and metal layer 102 further function to absorb and remove an undesired bulk acoustic wave component generated during the operation of the surface acoustic wave device. Furthermore, the epoxy bonding layer 103 and metal layer 102 act to prevent electrostatic or electromagnetic interactions between the electrodes of the surface acoustic wave device.

A method of fabricating the structure shown in FIG. 4 in accordance with the present invention will hereinafter be described in detail.

First, the layer 102 of metal, such as aluminum or gold, is deposited on an area of the silicon substrate 101 on which the crystal wafer 104 is to be laid. Then, the bonding layer 103 of epoxy resin is coated on the metal layer 102 to a thickness of 1~3 μm by using a spin coating process. The crystal wafer 104 is bonded on the epoxy bonding layer 103 and then ground from 600 μm to 100 μm in thickness by using a mechanical grinding process.

An SiC paper is typically used in the mechanical grinding process. Because the crystal wafer 104 must be sufficiently flat in surface, it is polished from 100 μm to 50 μm in thickness by using a diamond paste. In the surface acoustic wave device, the speed of the surface acoustic wave is constant, nearly regardless of the thickness of the piezoelectric crystal wafer if the thickness of the piezoelectric crystal wafer is greater than the wavelength of the surface acoustic wave. In this connection, differently from a crystal resonator using a bulk acoustic wave, there is no necessity for extremely precisely controlling the thickness of the piezoelectric crystal wafer. Finally, the metal pattern 105 of the surface acoustic wave resonator is formed on the piezoelectric crystal wafer 104 by using photolithography and etching processes and then connected with an oscillator circuit 205 on the silicon substrate 101 by the metal wire layer 106.

Figure 5:
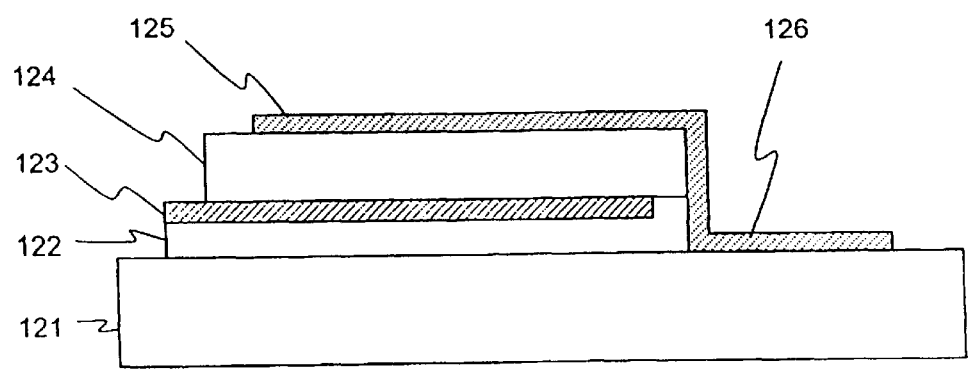
FIG. 5 is cross-sectional view of a bulk acoustic wave resonator in accordance with the present invention.

FIG. 5 is a sectional view of a bulk acoustic wave resonator in accordance with the present invention. As shown in this drawing, laid between electrodes 123 and 125 is a piezoelectric crystal wafer 124, the thickness of which is adjusted by a polishing process. An epoxy bonding layer 122 is applied between the piezoelectric crystal wafer 124 and a silicon substrate 121 to bond them to each other. The epoxy bonding layer 122 further functions to absorb an acoustic wave to be propagated into the silicon substrate 121. The respective layers are the same in thickness and fabrication process as those in the surface acoustic wave resonator of FIG. 4.

FIG. 6 schematically shows a single-chip radio structure in accordance with the present invention, in which a transmission/reception circuit is connected to the surface acoustic wave resonator in FIG. 4. As shown in this drawing, a radio receiver comprises an oscillator 205, frequency synthesizer 207, low-noise amplifier or preamplifier 211, down converter 212, demodulator/digital signal processor circuit 213 and audio amplifier 214. A part or all of them are formed on one silicon substrate by using well-known VLSI fabrication processes such as a CMOS, bipolar, etc. and then connected to the surface acoustic wave resonator on the piezoelectric crystal wafer 104 through the metal wires 106 and 202.

The oscillator 205 is a general oscillation circuit using a crystal, which may be constructed in various manners. One example of the oscillator 205 is the Colpitts-type oscillator shown in FIG. 1.

Figure 1:
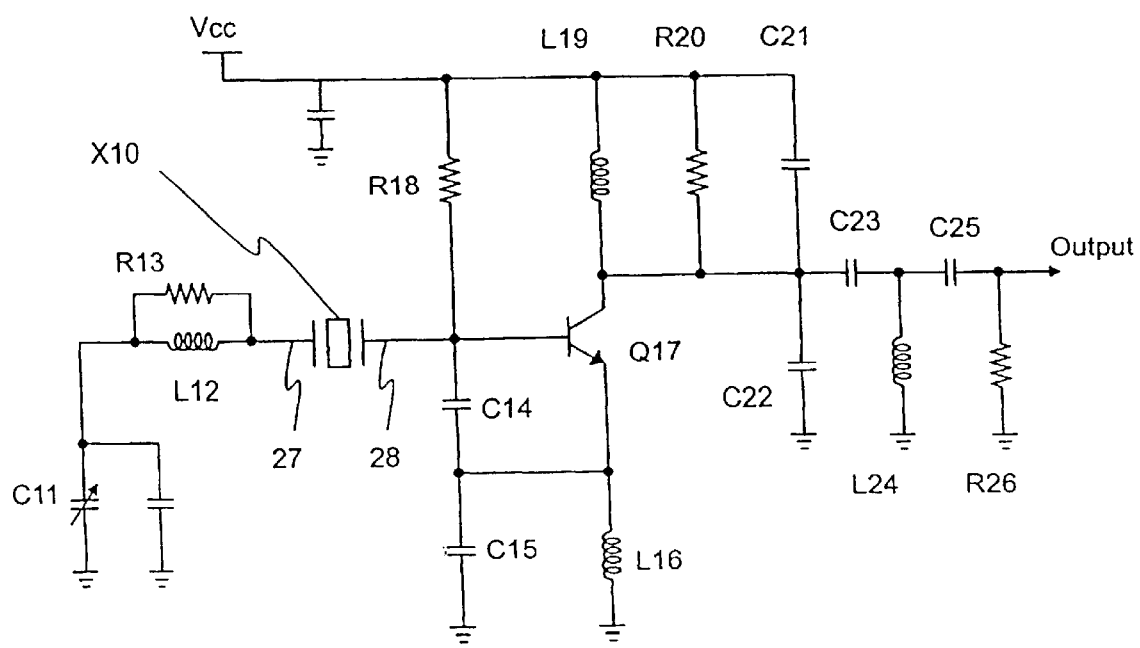
FIG. 1 is a circuit diagram showing the construction of a conventional fixed frequency oscillator using a crystal resonator.
Figure 2:
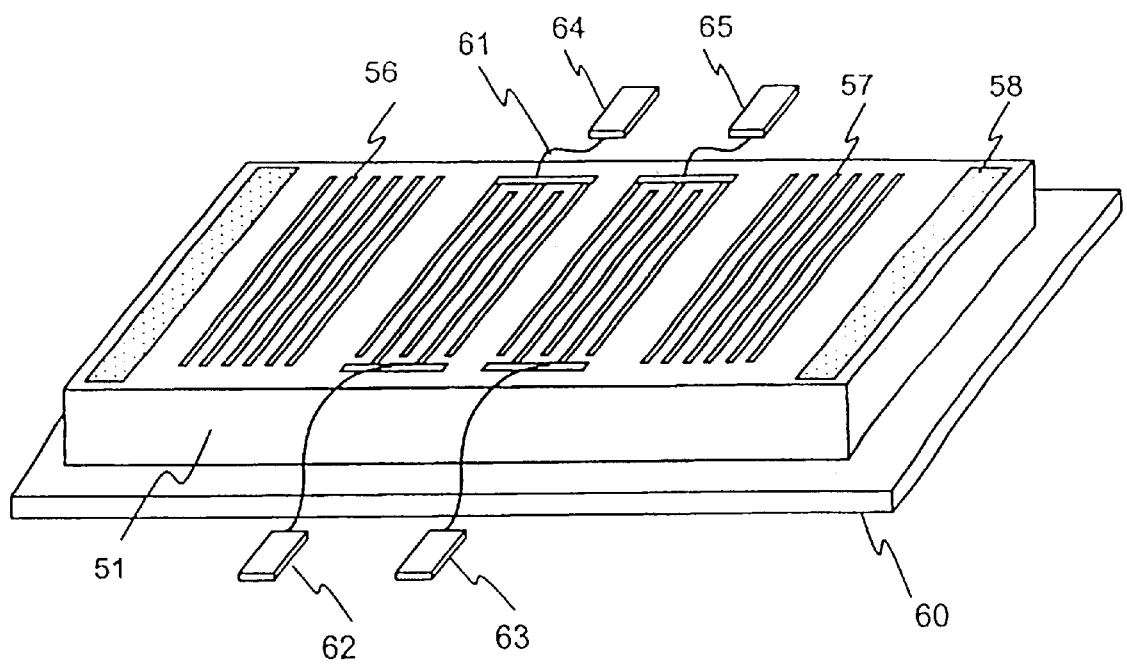
FIG. 2 is a perspective view of a conventional 2-terminal surface acoustic wave resonator formed on a piezoelectric crystal wafer.

In the oscillator of FIG. 1, the crystal resonator X10 is preferably replaced with the surface acoustic wave resonator in FIG. 4. A variable capacitor C11 may be provided with a varactor diode or a digitally controlled capacitor bank for performing a frequency trimming or tuning function. Capacitors C14 and C15 and an inductor L16 may be appropriately selected in value to satisfy an oscillating condition.

The output 206 of the oscillator 205 is supplied as a reference frequency signal to the frequency synthesizer 207, the output 208 of which is applied as a local oscillation signal to the down converter 212.

Signal lines 27 and 28 for connection of the crystal resonator with the circuitry in the conventional oscillator are preferably replaced with the metal wires 136 and 202 on the silicon substrate. The metal wires 106 and 202 can be formed by a general photolithography or wire bonding process, resulting in an advantage in occupying area or mass production.

As apparent from the above description, according to the present invention, a thin or thick piezoelectric crystal wafer is bonded on a silicon substrate and adjusted in thickness by mechanical grinding and polishing processes. Then, a surface acoustic wave device and other passive devices are formed on the piezoelectric crystal wafer by a standard lithography process. Therefore, a high-precision oscillator and various passive devices can be included in a monolithic integrated circuit to implement a single-chip radio structure. This single-chip radio structure has the effect of reducing the volume and weight of the entire receiver while maintaining excellent performances provided by passive devices on a crystal substrate, such as frequency stability, frequency linearity and low power consumption, etc., as they are.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a single-chip radio structure with a piezoelectric crystal device integrated on a monolithic integrated circuit, comprising the steps of:

(a) bonding a metal layer selected from the group consisting of aluminum and gold on an area of a silicon substrate on which a piezoelectric crystal wafer is to be laid;

(b) coating an epoxy bonding layer on said metal layer by a spin coating process;

(c) bonding said piezoelectric crystal wafer on said epoxy bonding layer;

(d) adjusting a thickness of said piezoelectric crystal wafer by mechanical grinding and polishing;

(e) forming a surface acoustic wave resonator on the piezoelectric crystal wafer by using photolithography and etching a part of said piezoelectric crystal wafer with a solvent; and (f) connecting the resonator with an oscillator circuit on said silicon substrate by a metal wire layer.

* * * * *